Nov. 17, 1970 O. F. JOSEPH 3,540,950

METHODS OF MANUFACTURING PLANAR TRANSISTORS

Filed Dec. 26, 1967

INVENTOR
Owen Francis Joseph
BY
Baldwin, Wight, Diller & Brown
ATTORNEYS 3,540,950
Patented Nov. 17, 1970

1

3,540,950

METHODS OF MANUFACTURING PLANAR TRANSISTORS

Owen Francis Joseph, Harlow, England, assignor to The Marconi Company Limited, London, England, a British company Filed Dec. 26, 1967, Ser. No. 693,576
Claims priority, application Great Britain, Jan. 19, 1967, 2,795/67
Int. Cl. H01l 7/34
U.S. Cl. 148—187 1 Claim

ABSTRACT OF THE DISCLOSURE

In a known method of manufacturing planar transistors P-type impurities are diffused into a silicon chip through an aperture in an oxide coating layer. The oxide layer formed at the aperture during the diffusion is removed and N-type impurities are diffused into the silicon. The resulting oxide layer is punctured to allow electrical connections to be made. Such transistors have the defect of undesirably high saturation currents.

In this invention further P-type impurities are diffused into the silicon, before the N-type are diffused in, forming a heavily doped region. Such transistors do not have the high saturation current defect.

The invention relates to methods of manufacturing planar transistors.

The invention will be explained with reference to the accompanying drawings in which FIGS. 1(*a*) to 1(*d*) show diagrammatic cross-sectional views through a silicon chip at different stages in a known method of manufacture of a planar transistor, and FIGS. 2(*a*) to 2(*d*) show, by way of example, diagrammatic cross-sectional views through a silicon chip at different stages in a method of manufacture of a planar transistor in accordance with the invention.

Figure 1:
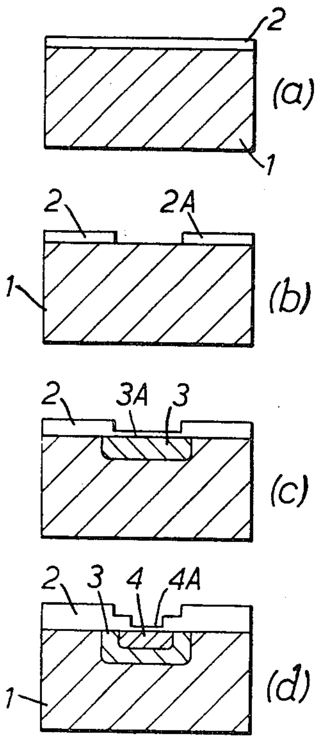

In FIG. 1(*a*) there is shown a body 1 of N-type silicon having a silicon dioxide layer 2 formed on one major surface. In a known method of manufacturing a planar transistor a portion of the silicon dioxide is etched away at 2A to expose the silicon surface as illustrated in FIG. 1(*b*). P-type impurities are then diffused into the silicon chip through the aperture in the silicon dioxide to form a P-doped region 3. During the diffusion process a silicon dioxide layer 3A is formed again over the previously exposed silicon surface. Both the P-doped region 3 and the regrown oxide layer are shown in FIG. 1(*c*). An aperture is then again made in the regrown oxide layer to expose a portion of the surface of the P-doped region 3 and N-type impurities are diffused therein to form an N-doped region 4, as shown in FIG. 1(*d*). An oxide layer 4A once again builds up on the surface of the chip during the diffusion process. Finally holes, not shown, are etched through the oxide layer to permit electrical connections to be made to the various chip regions.

It has been found in practice that planar transistors produced in accordance with the above process commonly have undesirably high saturation or reverse currents. Whilst the invention is not dependent upon the accuracy and sufficiency or otherwise of the theory now to be advanced, it is believed that the high saturation current results from P-type impurities being depleted at the surface of the P-region by absorption of the said impurities into the oxide layer during oxide growth after P-type diffusion, the N-type diffusion and subsequent oxide regrowth, this depletion producing a high resistivity layer at the surface of the region and hence high saturation currents.

2

The present invention has the object of reducing or eliminating the hitherto experienced defect of high saturation current.

According to this invention a method of manufacturing a planar transistor comprises the steps of diffusing P-type impurities into an N-type silicon chip through an aperture in an oxide layer coating the chip to form a P-doped region in the chip; removing the oxide layer formed at said aperture during the diffusion process; introducing further P-type impurities through the aperture to produce a P+ layer at the surface of the P-doped region; and subsequently diffusing N-type impurities into the P-doped region to produce an N-doped region therein. It is believed that during said subsequent N-type diffusion process, P-type impurities from the P+ layer are absorbed by the oxide layer but because of the high concentration of the P-type impurities in this layer the P-doped region does not become over-depleted. Planar transistors made in accordance with the manufacturing process in this invention manifest materially lower saturation currents than do comparable transistors made by the above described known process.

Figure 2:
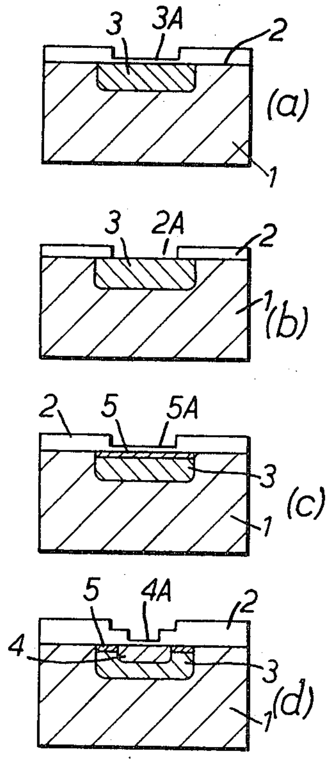

Referring now to FIG. 2 of the drawing, there is shown in FIG. 2(*a*) a silicon chip 1 with an oxide coating 2 thereon and a P-doped region 3 formed therein. This chip at this stage has been subjected to the first stages of the above described known process and corresponds to the chip shown in FIG. 1(*c*). In the manufacturing process according to this invention, however, the regrown oxide layer 3A produced in the aperture 2A is removed to expose the silicon surface as shown in FIG. 2(*b*). P-type impurities are then introduced through the aperture 2A to produce a P+ layer 5 at the surface of the P-doped region 3 and an oxide layer 5A is again grown above this layer. An aperture is then etched through the layer 5A and N-type impurities are diffused therethrough into the P-doped region to produce an N-doped region 4. As before, an oxide layer 4A grows during the diffusion process to close the aperture in the layer 5A. Finally holes (not shown) are etched into the oxide layer to permit electrical connections to be made to the various regions.

The following practical values may be employed in carrying out the process according to this invention although the process is not to be construed as being limited to the use of these values:

The N-type silicon material 1 may have a resistivity of 0.3 to 5 ohms cm., the P-doped region 3 at stage 2(*a*) may have a surface concentration of P-type impurities of $5\times10^{18}$ to $1\times10^{19}$ atoms per cc., the P+ layer 5 may have a concentration of P-type impurities of $1\times10^{19}$ to $5\times10^{19}$ atoms per cc., the depth of the P-region including the P+ layer may be 1.8 to 2.5$\mu$ and the depth of the P+ layer may be approximately 0.5$\mu$.

I claim:

1. A method of manufacturing a planar transistor comprising the steps of diffusing P-type impurities into an N-type silicon chip through an aperture in an oxide layer coating the chip to form a P-doped region in the chip; removing the oxide layer formed at said aperture during the diffusion process; introducing further P-type impurities through the aperture to produce a P+ layer at the surface of the P-doped region; and subsequently diffusing N-type impurities into the P-doped region to produce an N-doped region therein.

References Cited

UNITED STATES PATENTS

| | | | |
|---|---|---|---|
| 3,194,699 | 7/1965 | White | 148—187 |
| 3,347,720 | 10/1967 | Bryan et al. | 148—187 |
| 3,378,915 | 4/1968 | Zenner | 148—187 |
| 3,394,037 | 7/1968 | Robinson | 148—187 |

L. DEWAYNE RUTLEDGE, Primary Examiner

R. A. LESTER, Assistant Examiner

U.S. Cl. X.R.

29—578; 148—188